(12) United States Patent
Goerlach et al.

(10) Patent No.: US 8,816,467 B2
(45) Date of Patent: Aug. 26, 2014

(54) SEMICONDUCTOR DEVICE AND METHOD FOR MANUFACTURING SAME

(75) Inventors: Alfred Goerlach, Kusterdingen (DE); Ning Qu, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 1762 days.

(21) Appl. No.: 11/666,788

(22) PCT Filed: Oct. 21, 2005

(86) PCT No.: PCT/EP2005/055463
§ 371 (c)(1),
(2), (4) Date: Oct. 29, 2007

(87) PCT Pub. No.: WO2006/048387
PCT Pub. Date: May 11, 2006

(65) Prior Publication Data
US 2008/0197439 A1    Aug. 21, 2008

(30) Foreign Application Priority Data

Nov. 8, 2004   (DE) .......................... 10 2004 053 761

(51) Int. Cl.
*H01L 29/66*      (2006.01)
(52) U.S. Cl.
USPC ......................................................... 257/475
(58) Field of Classification Search
USPC ......................................................... 257/476
See application file for complete search history.

(56) References Cited

U.S. PATENT DOCUMENTS

| | | |
|---|---|---|
| 4,982,260 A | 1/1991 | Chang et al. |
| 5,241,195 A | 8/1993 | Tu et al. |
| 6,078,090 A | 6/2000 | Williams et al. |
| 6,590,240 B1 | 7/2003 | Lanois |
| 2001/0000033 A1 | 3/2001 | Baliga |
| 2002/0008237 A1 | 1/2002 | Chang et al. |

FOREIGN PATENT DOCUMENTS

| | | |
|---|---|---|
| DE | 197 49 195 | 6/1999 |
| EP | 1139433 | 10/2001 |
| EP | 1 369 927 | 12/2003 |
| JP | 61-147570 | 7/1986 |
| JP | 3-105975 | 5/1991 |
| JP | 5-226638 | 9/1993 |
| JP | 9-102605 | 4/1997 |
| JP | 2000-77682 | 3/2000 |
| JP | 2003-510817 | 3/2003 |
| JP | 2004-6723 | 1/2004 |
| JP | 2004-127968 | 4/2004 |
| WO | WO 01/22498 | 3/2001 |

OTHER PUBLICATIONS

T. Sakai et al., "Experimental investigation of dependence of electrical characteristics on device parameters in Trench MOS Barrier Schottky Diodes," Proceedings of 1998 International Symposium on Power Semiconductors & ICs, Kyoto, pp. 293-296.

S. Kunori et al., "Low Leakage current Schottky barrier diode," Proceedings of 1992 International Symposium on Power Semiconductors & ICs, Tokyo, pp. 80-85.

*Primary Examiner* — Yu-Hsi D Sun
(74) *Attorney, Agent, or Firm* — Kenyon & Kenyon LLP

(57) ABSTRACT

A semiconductor device including a Schottky diode of the trench-junction-barrier type having an integrated PN diode, and a corresponding method for manufacturing the device, are provided. An n layer is provided on an $n^t$ substrate, and trenches are provided in the n layer. The trenches are provided with p-doped regions. The $n^t$ substrate and the n layer carry a contact layer.

7 Claims, 6 Drawing Sheets

SEMICONDUCTOR DEVICE AND METHOD FOR MANUFACTURING SAME

BACKGROUND OF THE INVENTION

1. Field of the Invention

The present invention relates to a semiconductor device which is a junction-barrier Schottky diode having a trench structure, which semiconductor device is suitable as a Z diode (Zener diode) for use in the electrical system of a motor vehicle.

2. Description of Related Art

In modern motor vehicles, more and more functions are being implemented using electrical components. This results in an ever-increasing demand for electric power. To meet this demand, the efficiency of the generator system in the motor vehicle must be increased. So far, PN diodes have been usually used as Z diodes in the generator system of the motor vehicle. Advantages of PN diodes include low reverse current and great sturdiness. However, the main disadvantage is a comparatively high forward voltage UF. At room temperature, current begins to flow only at a forward voltage UF of approximately 0.7 V. Under normal operating conditions at which the current density is approximately 500 A/cm$^2$, forward voltage UF increases to more than 1 V. This results in a decline in efficiency.

On the basis of theoretical considerations, the Schottky diode might be considered as an alternative. A Schottky diode has a much lower forward voltage than a PN diode. For example, the forward voltage of a Schottky diode is approx. 0.5 V to 0.6 V at a current density of approximately 500 A/cm$^2$. Furthermore, a Schottky diode as a majority carrier component offers advantages in rapid switching operation. Inasmuch as is known, however, Schottky diodes have not yet been used in the generator system of a motor vehicle. This may be attributed to some significant disadvantages of a Schottky diode which make such an application appear to be less relevant. First, a Schottky diode has a higher reverse current than a PN diode. This reverse current also has a strong dependence on the reverse voltage. Finally, a Schottky diode has inferior sturdiness, in particular at high temperatures. These disadvantages have so far prevented the use of Schottky diodes in automotive applications.

Measures for improving the properties of Schottky diodes are already known from T. Sakai et al., "Experimental investigation of dependence of electrical characteristics on device parameters in Trench MOS Barrier Schottky Diodes," Proceedings of 1998 International Symposium on Power Semiconductors & ICs, Kyoto, pp. 293-296, S. Kunori et al., "Low leakage current Schottky barrier diode," Proceedings of 1992 International Symposium on Power Semiconductors & ICs, Tokyo, pp. 80-85, as well as DE 19 749 195 A1, resulting in the so-called JBS (JBS=junction-barrier Schottky diode) or the so-called TMBS (TMBS=trench-MOS-barrier Schottky diode). In the case of a JBS, the Schottky effect which is responsible for a high reverse current may be at least partially screened via suitable dimensioning of certain structural parameters and the reverse current thereby reduced. More extensive screening, e.g., by an even deeper p diffusion, however, is not feasible because at the same time the diffusion region would also be extended further in the lateral direction. However, the area available for current flow in the forward direction would then be further reduced in a deleterious manner. The advantage of a TMBS is the possible reduction in reverse current. Reverse current flows mainly along the surface of a trench formed in the diode structure through a quasi-inversion layer of the MOS structure of the diode. Consequently, the MOS structure may be degraded from an n-epi layer to an oxide layer by injection of "hot" charge carriers and may even be destroyed under particularly adverse conditions. Since a certain amount of time is needed for formation of the inversion channel, the space charge zone may briefly propagate further at the beginning of rapid switching operations and consequently the electrical field strength may increase. This may result in brief unwanted breakdown operation of the diode. It is therefore not very advisable to use a TMBS that has been improved with regard to the reverse current as a Z diode and operate it in the breakdown range.

BRIEF SUMMARY OF THE INVENTION

The present invention provides a semiconductor device having a low forward voltage, low reverse current and great sturdiness.

This offers the advantage in particular that the sensitive oxide layers are replaced by a p-doped silicon area, and injection of "hot" charge carriers no longer occurs. This is achieved by the fact that the high field strength occurring in a breakdown is not near the sensitive oxide layer because the breakdown voltage of the integrated PN diode is lower than the breakdown voltages of the Schottky diode and the MOS structure. The semiconductor device configured according to the present invention is therefore characterized by a particularly great sturdiness, which permits reliable use of the semiconductor device in the electrical system of a motor vehicle, in particular in the generator system of the electrical system. It is particularly advantageous that the semiconductor device is reliable when operated at breakdown voltages on the order of a few 10 V and at current densities of few hundred A/cm$^2$. A first example embodiment of the semiconductor device advantageously includes an n+ substrate on which there is an n layer in which trenches have been created. The trenches are completely filled with p-doped material, forming p-doped regions there. The n+ substrate and the n layer each carry a contact layer.

A second example embodiment of the semiconductor device according to the present invention includes an n+ substrate on which there is an n layer in which trenches have been created. The trenches are completely lined with p-doped regions. The n+ substrate and the n layer carry contact layers.

DETAILED DESCRIPTION OF THE INVENTION

Figure 1:
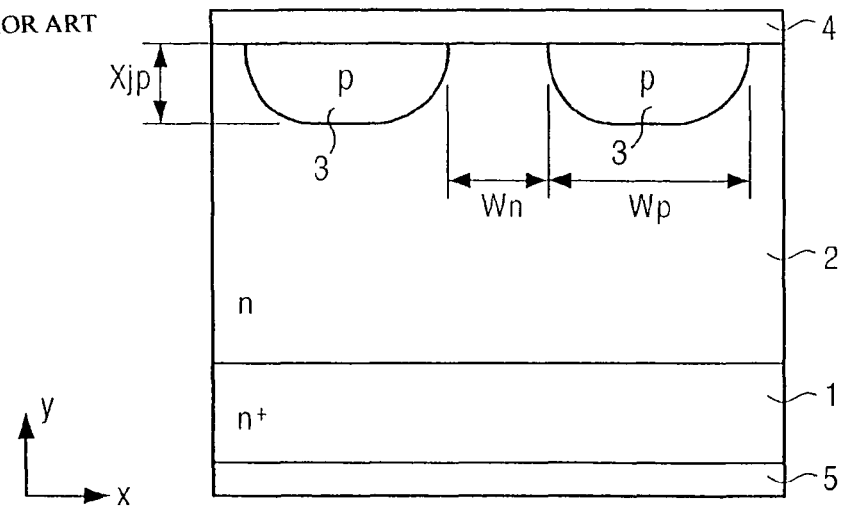
FIG. 1 shows a conventional junction-barrier Schottky diode.

Known semiconductor devices are described briefly below to better present the advantages achievable with the present invention. FIG. 1 shows a semiconductor device 10 in the form of a traditional JBS (junction-barrier Schottky diode), which includes an n+ substrate 1, an n-layer 2, at least two p troughs 3 that have diffused into n-layer 2 and contact layers 4 and 5 on the front and back sides of the chip. Electrically, a JBS is a combination of a PN diode (PN junction between p troughs 3 as the anode and n-layer 2 as the cathode) and a Schottky diode (Schottky barrier between contact layer 4 as the anode and n-layer 2 as the cathode). Contact layer 5 on the back side of the chip functions as the cathode, while contact layer 4 on the front side of the chip functions as the anode with ohmic contact to p troughs 3 and at the same time functions as a Schottky contact to n-layer 2. Because of the low forward voltage of the Schottky diode in comparison with the PN diode, a current flows in the forward direction only through the region of the Schottky diode. Consequently, the effective area (per unit of area) for current flow in the forward direction in a JBS is much smaller than that with a conventional planar Schottky diode. In the reverse direction, the space charge zones expand with an increase in voltage and collapse in the middle of the region between neighboring p troughs 3 at a voltage lower than the breakdown voltage of the JBS. The Schottky effect, which is responsible for the high reverse current, is thus partially screened and therefore the reverse current is reduced. This screening effect depends greatly on certain structural parameters such as Xjp (depth of penetration of p diffusion), Wn (distance between p troughs) and Wp (width of the p trough). A conventional method for implementation of p troughs of a JBS is p implantation and subsequent p diffusion. By lateral diffusion in the x direction, the depth of which is comparable to vertical diffusion in the y direction, cylindrical p troughs are formed in the two-dimensional representation (infinite length in the z direction perpendicular to the xy plane), the radius of which corresponds to depth of penetration Xjp. Because of the radial extent of the space charge zones, this shape of p troughs does not, however, manifest particularly effective screening of the Schottky effect. It is also impossible to reinforce the screening merely via deeper p diffusion because the lateral diffusion also becomes accordingly broader at the same time. In addition, it is also very objectionable to further reduce distance Wn between the p troughs. Although this would increase the screening effect, the effective surface area for current flow in the forward direction would be further reduced.

Figure 2:
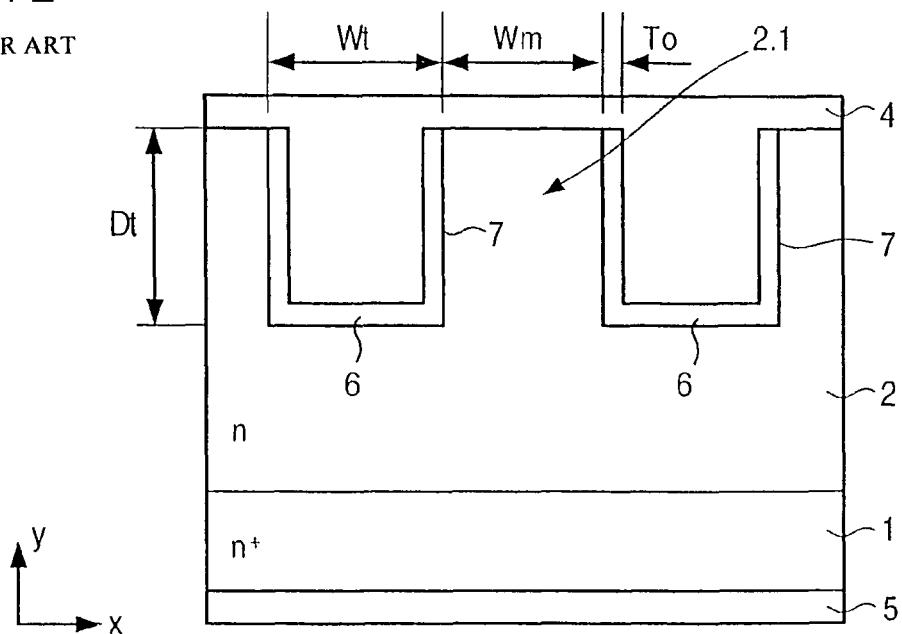
FIG. 2 shows a conventional trench-MOS-barrier Schottky diode.

FIG. 2 shows a known semiconductor device 20, namely a TMBS diode, referred to below simply as a TMBS (trench-MOS-barrier Schottky diode). First, the design of such a TMBS will be described to also show more clearly the advantages achieved with the present invention in comparison with this semiconductor device 20. Semiconductor device 20 has an n+ substrate 1 and an n-layer 2 on this n+ substrate. Trenches 7 are created in this n-layer 2. The bottom areas and walls of trenches 7 are covered with an oxide layer 6. A metal layer 4 on the front side of TMBS 20 functions as an anode. A metal layer 5 on the back of TMBS 20 functions as a cathode. Electrically, TMBS 20 is a combination of an MOS structure (metal layer 4, oxide layer 6 and n-layer 2) and a Schottky diode. The Schottky barrier here is between metal layer 4 as the anode and n-layer 2 as the cathode.

A current flows in the forward direction through mesa region 2.1 of TMBS 20 enclosed by trenches 7. Trenches 7 themselves are not available for current flow. The effective area for current flow in the forward direction is therefore smaller with a TMBS than with a conventional planar Schottky diode. The advantage of such a TMBS 20 is the reduction in the reverse current. In the reverse direction, space charge zones develop with both the MOS structure and the Schottky diode. The space charge zones expand with an increase in voltage, and come into contact with each other in the middle of mesa region 2.1 between neighboring trenches 7 at a voltage lower than the breakdown voltage of TMBS 20. Therefore, the Schottky effect responsible for the high reverse current is screened and the reverse current is reduced. This screening effect depends greatly on the structural parameters of the TMBS, such as in particular Dt (depth of trench 7), Wm (distance between trenches 7), Wt (width of trench 7) and To (thickness of oxide layer 6). The screening action for the Schottky effect is therefore much more effective in the TMBS in comparison with a JBS having diffused p troughs. However, a significant disadvantage of the known TMBS is the weakness of the MOS structure. In a breakdown, very large electrical fields occur within oxide layer 6 and in n-layer 2 in the immediate vicinity of oxide layer 6. Reverse current flows mainly through the quasi-inversion layer of the MOS structure along the surface of trenches 7. As a result, the MOS structure may be degraded by injection of "hot" charge carriers from n-layer 2 into oxide layer 6 and may even be destroyed under certain adverse operating conditions. Since a certain amount of time is needed to form the inversion channel (deep depletion), the space charge zone may spread out further briefly at the beginning of fast switching operations and therefore the electrical field strength may increase further. This may result in a brief unwanted breakdown operation. It is therefore not advisable to use a TMBS as a Zener diode or to operate it in the breakdown range.

Against this background, the present invention provides novel semiconductor devices characterized by a low forward voltage, a low reverse current and great sturdiness. This is a junction-barrier Schottky diode (JBS) having a trench structure, which may also be referred to as a trench-junction-barrier Schottky diode (TJBS).

Instead of p diffusion with a relatively great depth of penetration (e.g., Xjp>1 µm) as in a conventional JBS, the p troughs of the TJBS are implemented by etching and subsequently filling the trenches with p-doped Si and/or poly-Si. As an alternative, the p-trenches of the TJBS may also be produced by etching and subsequently covering with boron in combination with shallow boron diffusion, e.g., Xjp<0.2 µm. Breakdown voltage BV_Pn of the PN diode is expediently lower than breakdown voltage BV_schottky of the Schottky diode. The TJBS has a high current capacity in the forward direction, high screening action of the Schottky effect in the reverse direction and therefore a low reverse current, great sturdiness due to the clamping function of the PN diode and breakdown at the bottom of the trenches. It is therefore particularly suitable as a Z diode for use in automotive generator systems.

Figure 3:
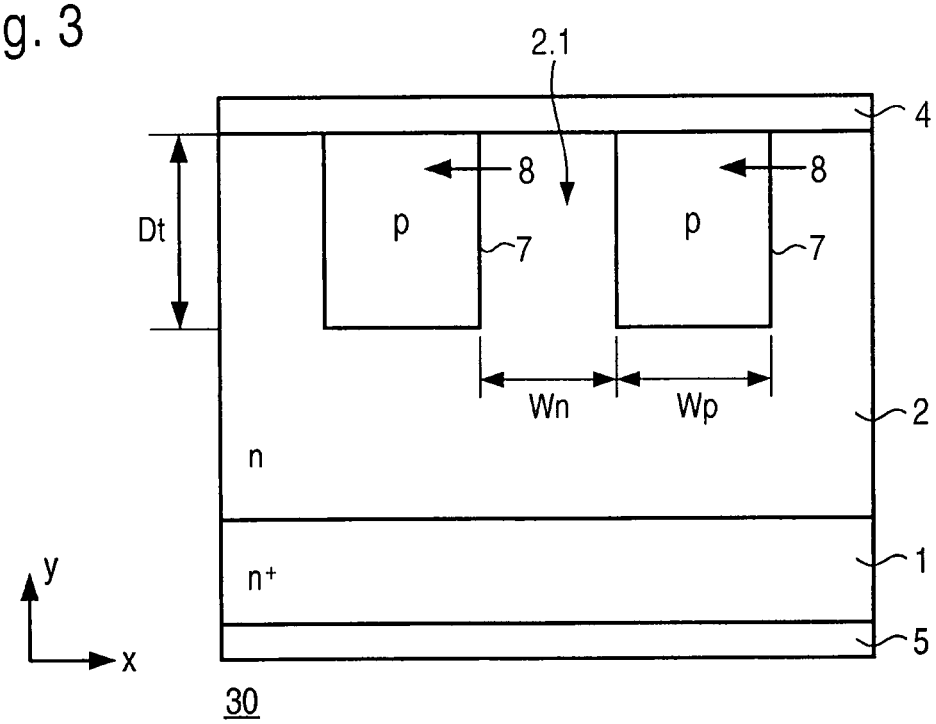
FIG. 3 shows a first exemplary embodiment of a semiconductor device according to the present invention.

A first example embodiment of the present invention relates to a semiconductor device 30 in the form of a TJBS having filled trenches, which are described in greater detail below with reference to FIG. 3. As FIG. 3 shows, semiconductor device 30 includes an n+ substrate 1, an n-layer 2 on this n+ substrate 1 and at least two trenches 7 formed in n-layer 2. In addition, contact layers 4, 5 that function as the anode and cathode are provided on the front and back sides of semiconductor device 30. Trenches 7 are preferably created by an etching process. Contact layers 4, 5 are preferably made of a metal. Metal layer 4 may in particular also have two different superimposed metal layers. Trenches 7 are filled with p-doped Si or poly-Si, resulting in p-doped regions 8. Electrically, semiconductor device 30 TJBS is a combination of a PN diode (PN junction between p-doped regions 8 as the anode and n-layer 2 as the cathode) and a Schottky diode (Schottky barrier between contact layer 4 as the anode and n-layer 2 as the cathode). As in a conventional junction-barrier Schottky diode, the current flows only through the Schottky diode in the forward direction of the diode. However, due to the lack of lateral p diffusion, the effective area for current flow in the forward direction in a trench-junction-barrier Schottky diode is similar to that in a trench-MOS-barrier Schottky diode and is much larger than that with a conventional junction-barrier Schottky diode. In the reverse direction, the space charge zones expand with an increase in voltage, coming into contact in the middle of the region between neighboring p regions 8 at a voltage lower than the breakdown voltage of the trench-junction-barrier Schottky diode. As in the junction-barrier Schottky diode, the Schottky effect responsible for a high reverse current is thereby screened and the reverse current is therefore reduced. This screening effect depends greatly on structural parameters such as Dt (depth of trenches 7), Wn (distance between trenches 7), and Wp (width of trench 7). For implementation of trenches 7 in a TJBS, there is no p diffusion. Therefore, there is no negative effect of lateral p diffusion as in a conventional JBS. A quasi-one-dimensional extent of the space charge zones in mesa region 2.1 between trenches 7 is easily implemented because depth Dt of trench 7, which is an important structural parameter for screening of the Schottky effect, no longer correlates with the effective area for current flow in the forward direction. The screening action for the Schottky effect is similar to that in the case of the TMBS and is thus much more effective than in the case of a traditional JBS having diffused p troughs. However, the TJBS offers great sturdiness due to the clamping function which is now provided by the PN diode. Breakdown voltage BV_pn of the PN diode is designed to be lower than breakdown voltage BV_schottky of the Schottky diode. In addition, the breakdown takes place at the bottom of trenches 7. In a breakdown operation, the reverse current then flows only through the PN junction of the PN diode. The forward direction and reverse direction are thus geometrically separated. The TJBS thus has a sturdiness similar to that of a PN diode. For implementation of semiconductor device 30 in the form of a TJBS, an abrupt PN junction may be provided. In addition, charge compensation is avoided, as is the case with a "cool Schottky diode," because highly blocking diodes are not considered here primarily but instead Z diodes having a breakdown voltage on the order of a few tens of volts, in particular approximately 20 V-40 V are considered. Furthermore, injection of "hot" charge carriers does not occur with the TJBS because there is no MOS structure. Consequently, the TJBS is particularly suitable as a Z diode for use in the electrical system of a motor vehicle, in particular for use in the generator system of a motor vehicle.

Figure 8:
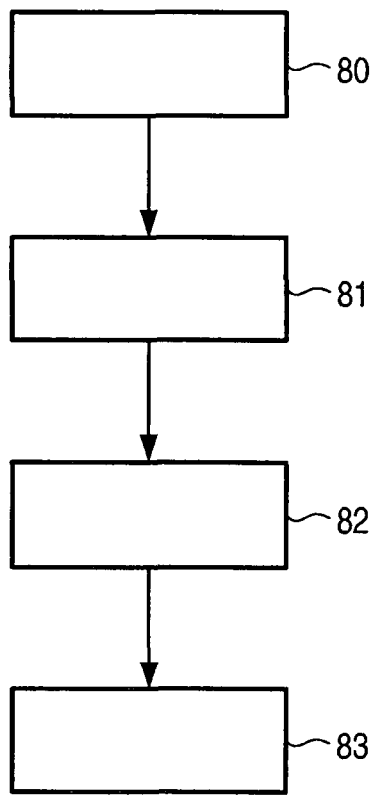
FIG. 8 shows a flow chart of a first implementation of a manufacturing method according to the present invention.

An advantageous example manufacturing method for semiconductor device 30 is described below. In this context, reference is also made to the flow chart illustrated in FIG. 8. The procedure starts with an n+ substrate 1 (step 80). An n-layer 2 is applied to this n+ substrate 1 (step 81). This is preferably performed by an epitaxial method. In a next step 82, trenches 7 are etched in n-layer 2. Trenches 7 are then filled with p-doped Si or poly-Si (step 83). In another step 84, contact layers 4 and 5, preferably made of metal, are applied to the front and back sides of semiconductor device 30.

Figure 4:
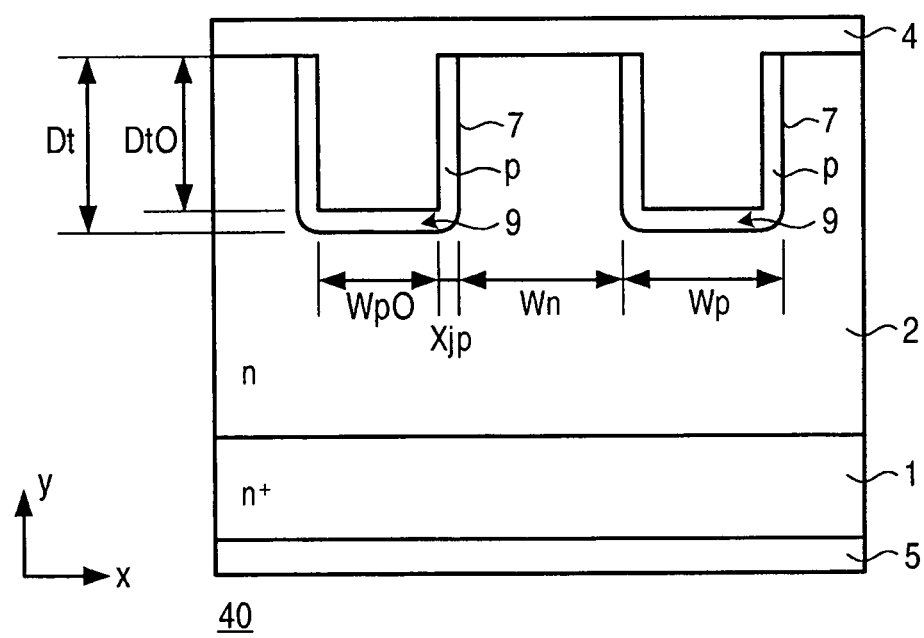
FIG. 4 shows a second exemplary embodiment of a semiconductor device according to the present invention.

Another example embodiment of the present invention is described below with reference to FIG. 4. Semiconductor device 40 shown in FIG. 4 also has an n+ substrate 1, an n-layer 2 thereon and at least two trenches 7 formed in n-layer 2. In trenches 7, p regions 9 cover the bottoms and side walls of trenches 7. In addition, contact layers 4, 5 are provided on the front side of the chip, including the surface of the trenches, as the anode and the cathode. In particular, contact layer 4 may also have two different metal layers one above the other. Trench 7 may be filled completely with the second metal layer. However, in this embodiment of the present invention, p regions 9 within trenches 7 are not implemented by filling them up with p-doped Si or poly-Si. Instead, p regions 9 are created by covering trenches 7 with a p dopant and then applying shallow diffusion. A suitable p dopant is boron. Again with this semiconductor device 40, an abrupt PN junction may be implemented. Due to a rich and very shallow diffusion with a depth of penetration of no more than 0.2 μm, for example, with a trench depth Dt0 of approximately 1 μm to 3 μm, in the embodiment according to FIG. 4, the screening action of the Schottky effect and the blocking capacity are very similar, as in the first embodiment having filled trenches 7 according to FIG. 3. This is also true of the high current capacity in the forward direction, the great sturdiness and good suitability as a Zener diode for use in the electrical system of a motor vehicle, in particular for use in the generator system of a motor vehicle. One advantage of this second embodiment of the present invention in comparison with the first embodiment of the present invention illustrated in FIG. 3 is that p regions 9 are easier to manufacture by covering with a dopant and then applying diffusion in comparison with filling trenches 7 with p-doped Si or poly-Si. However, one disadvantage of this variant is the reduction in size of the effective area for current flow in the forward direction due to p diffusion with depth of penetration Xjp. However, a detailed study has revealed that this disadvantage is practically negligible for a semiconductor device 40 having a breakdown voltage on the order of a few 10 V. With a semiconductor device 40 having a breakdown voltage of 20 V, the forward voltage is increased by only approximately 10 mV at room temperature and at a current density of approximately 500 A/cm$^2$.

Figure 9:
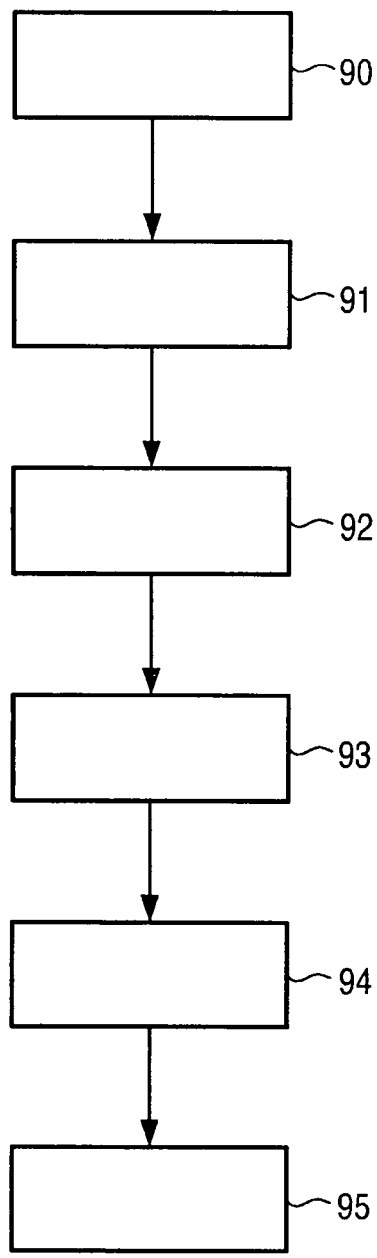
FIG. 9 shows a flow chart of a second implementation of a manufacturing method according to the present invention.

An advantageous example method for manufacturing semiconductor device 40 (embodiment according to FIG. 4) is described below, reference also being made to the flow chart in FIG. 9. Here again, the procedure starts with an n+ substrate 1 (step 90) to which an n-layer 2 is applied, e.g., by an epitaxial method (step 91). Trenches 7 are created in n-layer 2 by an etching method (step 92). Next the bottoms and side walls of trenches 7 are covered with a p dopant (step 93). Boron is used as the p dopant. The dopant is deposited in trenches 7 from the gas phase or introduced into trenches 7 by ion implantation. Next the diffusion process is performed (step 94) in which boron diffuses into n-layer 2, forming p regions 9. A particularly shallow p diffusion should be a goal here. This may be achieved advantageously by the method of rapid thermal annealing (RTA). Contact layers 4 and 5 are next again applied to the front and back sides of semiconductor device 40 (step 95).

Figure 5:
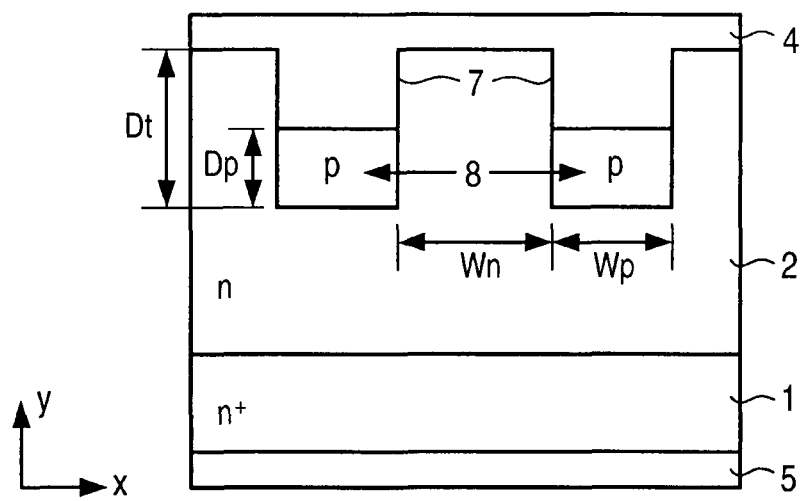
FIG. 5 shows a third exemplary embodiment of a semiconductor device according to the present invention.

With reference to FIG. 5, another example embodiment of the present invention is described below. Semiconductor device 50 shown in FIG. 5 includes an n+ substrate 1, an n-layer 2 on this substrate 1 and at least two trenches 7 created in n-layer 2. Again, n-layer 2 is preferably manufactured by an epitaxial method. Trenches 7 are created by an etching process. In addition, semiconductor device 50 includes contact layers 4, 5, preferably made of metal, on the front side as the anode and on the back side as the cathode. Metal layer 4 may in particular also be made of two different metal layers situated one above the other. In this embodiment of the present invention, however, trenches 7 are filled only partially, namely up to a thickness Dp, with p-doped Si or poly-Si 8, in contrast to the embodiment according to FIG. 3, so that p regions 8 are formed. Electrically, this embodiment is also a combination of a PN diode (PN junction between p-doped regions 8 as the anode and n-layer 2 as the cathode) and a Schottky diode (Schottky barrier between contact layer 4 as the anode and n-layer 2 as the cathode). However, the Schottky barrier is formed here both at the surface of semiconductor device 50 and on the side walls of the upper region of trenches 7 not filled with p-doped Si or poly-Si. One advantage of semiconductor device 50 is the lower forward voltage due to the larger area of the Schottky contact also on the side walls of the upper region of trenches 7. However, this also results in a higher reverse current, which is a certain disadvantage. In practice, however, this embodiment offers the possibility of optimizing semiconductor device 50 by adjusting parameter Dp on demand according to individual requirements with regard to the forward voltage and reverse current.

Figure 10:
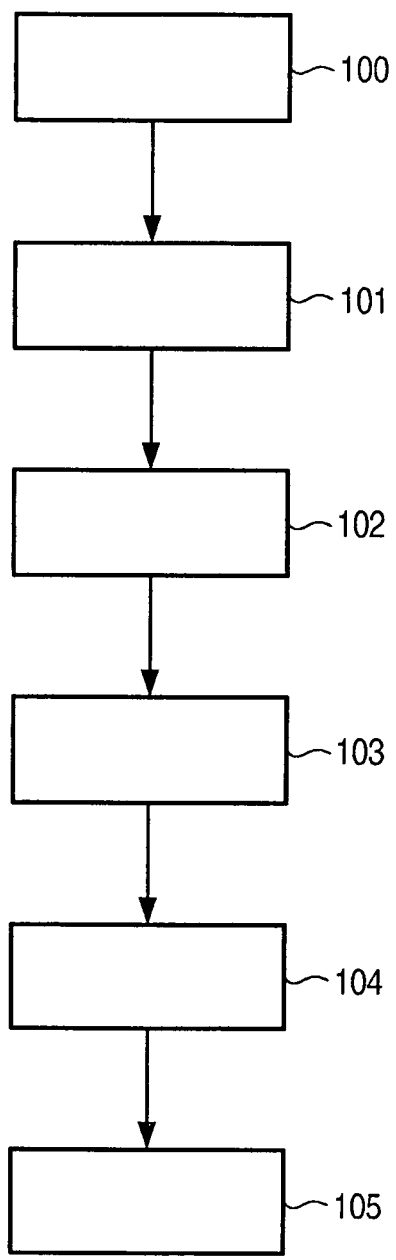
FIG. 10 shows a flow chart of a third implementation of a manufacturing method according to the present invention.

An advantageous method for manufacturing semiconductor device 50 (embodiment according to FIG. 5) is described below, reference also being made to the flow chart in FIG. 10. Again, the procedure starts with an n+ substrate 1 (step 100) to which an n-layer 2 is applied, preferably by an epitaxial method (step 101). Trenches 7 are created in n-layer 2 by an etching process (step 102). Trenches 7 are then filled with p-doped Si or poly-Si. In a next step (103), p-doped Si or poly-Si introduced into trenches 7 is again partially removed except for a remaining thickness Dp (step 104). This is expediently performed by an etching process. In conclusion, contact layers 4 and 5 are again applied to the front and back sides of semiconductor device 50 (step 105).

All the example embodiments described above may include additional structures for reducing the marginal field strength within the context of an advantageous refinement of the present invention, in the marginal area of the semiconductor device in each case. These structures may be magnetoresistors or the like, e.g., composed of low-doped p regions.

Figure 6:
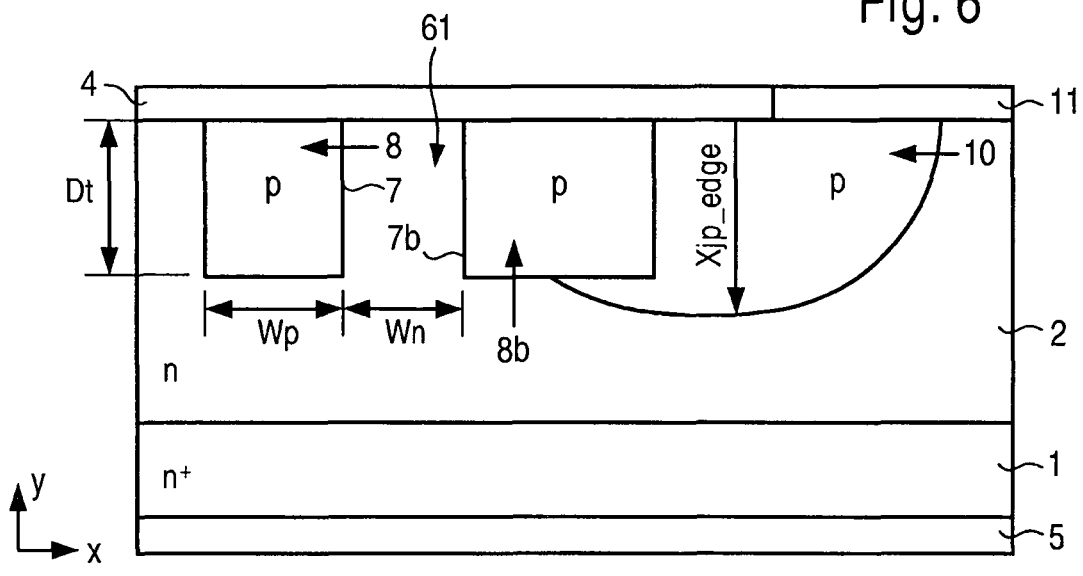
FIG. 6 shows a fourth exemplary embodiment of a semiconductor device according to the present invention.

Another advantageous example embodiment similar to FIG. 3 (semiconductor device 30) is described below with reference to FIG. 6, this variant additionally being provided with an edge structure for reducing the marginal field strength. Semiconductor device 60 shown there is characterized by a wide trench and a deep p diffusion at the edge of the semiconductor device. Semiconductor device 60 has an n+ substrate 1. An n-layer 2 is provided on n+ substrate 1. An additional trench 7b is created in n-layer 2. Trenches 7, 7b are in turn preferably created by an etching process. As FIG. 6 shows, trench 7b is designed to be wider than trench 7. Trenches 7, 7b are filled with p-doped Si or poly-Si, forming p-doped regions 8, 8b in trenches 7, 7b. A p-doped region 10 is connected directly to wider trench 7b. The side of n+ substrate 1 facing away from n-layer 2 in turn has a contact layer 5. A contact layer 4 is also applied to the front side of semiconductor device 60. This contact layer 4 does not cover the entire front side of the semiconductor device. It covers trenches 7, 7b, n-layer 2, which is exposed next to trenches 7, 7b, and only a portion of p-doped region 10. The remaining front side of semiconductor device 60 is covered with an oxide layer 11. This oxide layer 11 thus extends over a portion of p-doped region 10 and n-layer 2, which is exposed to the right thereof. To achieve a higher breakdown voltage at the edge of semiconductor device 60 than in comparison with the internal region of the semiconductor device, depth of penetration Xjp_edge of p-doped region 10 is advantageously selected to be greater than depth Dt of trenches 7, 7b. In addition, the position of trench 7b at the edge of semiconductor device 60 and the position of p-doped region 10 are selected so that the one edge area of p-doped region 10 ends below wider trench 7b and no longer comes in contact with mesa region 61 between trenches 7, 7b. The requirement that depth of penetration Xjp_edge of p-doped region 10 should be greater than depth Dt of trenches 7, 7b has a certain negative effect on the forward voltage because n-layer 2 must be designed to be accordingly somewhat thicker. However, a detailed study has shown that depth of penetration Xjp_edge of p-doped region 10 only needs to be slightly greater than depth Dt of trenches 7, 7b to advantageously achieve a higher breakdown voltage at the edge of semiconductor device 60. The negative effect of deeper p-doped region 10 on the forward voltage is thus negligible in practice.

Figure 11:
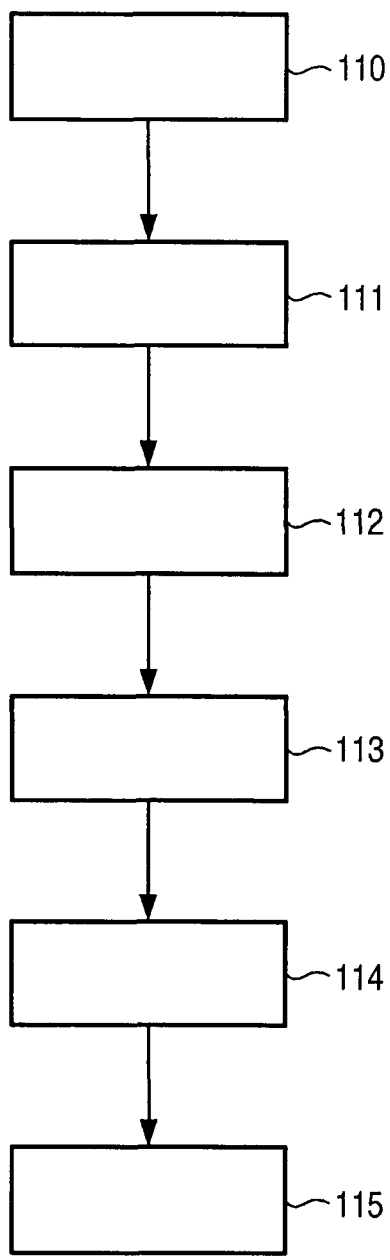
FIG. 11 shows a flow chart of a fourth implementation of a manufacturing method.

An advantageous example manufacturing method for a semiconductor device 60 is described below with reference to the flow chart in FIG. 11. Again the procedure starts with an n+ substrate 1 (step 110) to which an n-layer 2 is applied, e.g., by an epitaxial method (step 111). In a next step, p-doped region 10 is created by deep diffusion of a p dopant such as boron, in particular using a suitably designed mask on the front side (step 112). This may advantageously be accomplished by using p dopant to cover a region of the exposed surface of n-layer 2 not covered by the mask. This may be accomplished in turn by deposition of the dopant from the gas phase or by ion implantation. The dopant next diffuses into underlying n-layer 2 by heating. An etching process creates trenches 7, 7b in n-layer 2 (step 113), trench 7b being designed to be wider than trench 7. Trenches 7, 7b are then filled with p-doped Si or poly-Si (step 114), thus yielding p-doped region 8, 8b. Contact layers 4 and 5 are then again applied to the front and back sides of semiconductor device 60 (step 115). Here again, a masking technique is recommended because only a partial area of the front side of semiconductor device 60 is to be covered with contact layer 4. The remaining part of the surface is passivated with oxide layer 11.

Figure 7:
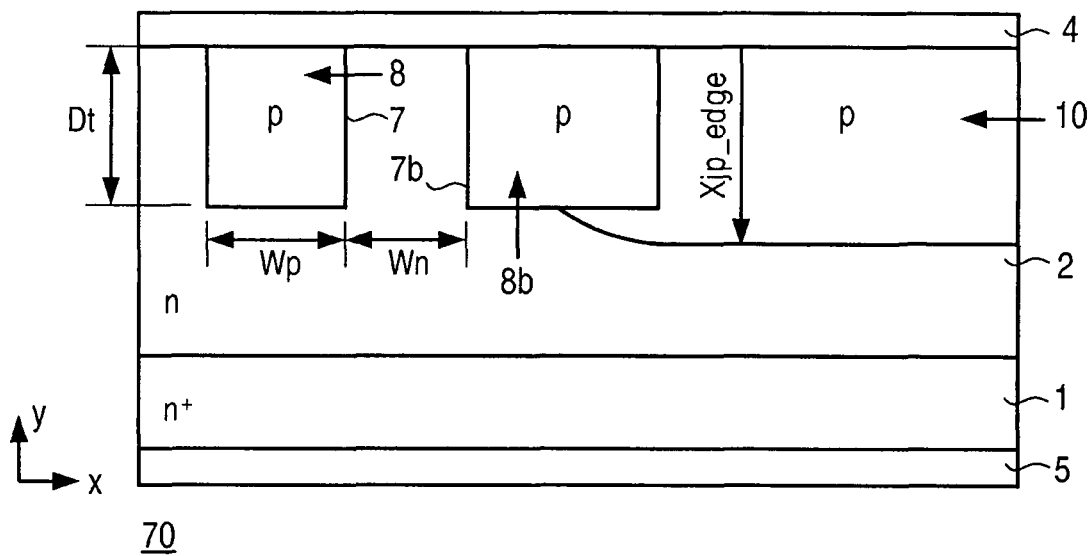
FIG. 7 shows a fifth exemplary embodiment of a semiconductor device according to the present invention.

Another advantageous example embodiment of the present invention is described below with reference to FIG. 7. Semiconductor device 70 shown in FIG. 7 is characterized by a wide trench and deep p diffusion at the edge of the semiconductor device, the diffusion region extending up to the edge of semiconductor device 70. Semiconductor device 70 has an n+ substrate 1. An n-layer 2 is provided on n+ substrate 1. Trenches 7, 7b are created in n-layer 2. Trenches 7, 7b are again created by an etching process. As shown in FIG. 7, trench 7b is designed to be wider than trenches 7. Trenches 7, 7b are filled with p-doped Si or poly-Si, yielding p-doped regions 8, 8b in trenches 7, 7b. A p-doped region 10 is connected directly to wider trench 7b. The side of n+ substrate 1 facing away from n-layer 2 carries a contact layer 5. A contact layer 4 is also applied to the front side of semiconductor device 60. To achieve a higher breakdown voltage at the edge of semiconductor device 70 than in the interior of the semiconductor device, depth of penetration Xjp_edge of p-doped region 10 is advantageously selected to be greater than depth Dt of trenches 7, 7b. In addition, the position of trench 7b at the edge of semiconductor device 60 and the position of p-doped region 10 are selected so that one edge area of p-doped region 10 ends beneath wider trench 7b and no longer comes in contact with mesa region 61 between trenches 7, 7b. The requirement that depth of penetration Xjp_edge of p-doped region 10 should be greater than depth Dt of trenches 7, 7b has a certain negative effect on the forward voltage because n-layer 2 must be designed to be accordingly somewhat thicker. However, a detailed study has shown that depth of penetration Xjp_edge of p-doped region 10 only needs to be slightly greater than depth Dt of trenches 7, 7b to advantageously achieve a higher breakdown voltage at the edge of semiconductor device 60. The negative effect of deeper p-doped region 10 on the forward voltage is thus negligible in practice. The difference between this embodiment and semiconductor device 60 shown in FIG. 6 is essentially that p-doped region 10 extends to the edge of semiconductor device 70. An "open" PN junction is therefore formed at the edge of semiconductor device 70, possibly resulting in a higher reverse current. However, the reverse current may be reduced significantly by a suitable etching technique. In this embodiment, it is advantageous that no mask is needed for applying the contact layer to the front side of the semiconductor device. In addition, a particularly favorable possibility for assembling the semiconductor device in a press-fit housing is available because there are no sensitive oxides on the surface of semiconductor device 70.

An advantageous example manufacturing method for semiconductor device 70 resembles the method already described for manufacturing semiconductor device 60. There are deviations only due to a modified mask structure for creating p-doped region 10, which now extends to the edge. In addition, no masking is necessary for applying contact layer 4 because contact layer 4 covers the entire front surface of semiconductor device 70.

In a similar manner, the edge structures described with reference to FIGS. 6 and 7 may also advantageously be used with the semiconductor devices described with reference to FIGS. 4 and 5.

The example embodiments of semiconductor devices configured according to the present invention as described above are advantageously suitable for use as Z diodes in the electrical system of a motor vehicle, in particular for use in the generator system of a motor vehicle. Therefore, the semiconductor devices expediently have a breakdown voltage between 12 V and 30 V, in particular between 15 V and 25 V.

These semiconductor devices are particularly advantageously operable in blocking operation with a high current density on the order of a few hundred A/cm$^2$, in particular 400 A/cm$^2$ up to approximately 600 A/cm$^2$.

What is claimed is:

1. A semiconductor device, comprising:
   a trench-junction-barrier Schottky diode; and
   a PN diode integrally formed with the Schottky diode, wherein the PN diode is configured to function as a clamping element, and wherein the breakdown voltage of the PN diode is lower than the breakdown voltage of the Schottky diode;
   wherein, for breakdown voltages on the order of magnitude of several $10^1$ volts, the semiconductor device is configured to operate in breakdown operation at a current density of approximately 400 A/cm$^2$ to approximately 600 A/cm$^2$; and
   wherein the semiconductor device includes: an n+ substrate; an n-layer provided on the n+ substrate; a plurality of trenches provided exclusively within the n-layer, wherein the trenches are filled with a p-doped material to form p-doped regions; and two contact layers provided for the n+ substrate and the n-layer, wherein the two contact layers cover the entire surfaces of the front and back sides of the semiconductor device.

2. The semiconductor device as recited in claim 1, wherein the thickness of the p-doped regions is approximately 0.2 μm.

3. The semiconductor device as recited in claim 1, wherein the depth of the trenches is approximately 1 μm to 3 μm.

4. The semiconductor device as recited in claim 1, wherein the trenches are configured as one of strips and islands.

5. The semiconductor device as recited in claim 1, wherein the semiconductor device is configured for use as a Z diode.

6. The semiconductor device as recited in claim 1, wherein the semiconductor device is configured for use in the generator system of a motor vehicle.

7. The semiconductor device as recited in claim 1, wherein semiconductor device has a breakdown voltage between approximately 10 V and 50 V.

* * * * *